United States Patent
Siligaris et al.

(10) Patent No.: US 9,800,441 B2
(45) Date of Patent: Oct. 24, 2017

(54) ULTRA WIDEBAND RADIO FREQUENCY TRANSMISSION SYSTEM

(71) Applicant: Commissariat à l'Energie Atomique et aux Energies Alternatives, Paris (FR)

(72) Inventors: Alexandre Siligaris, Grenoble (FR); Cédric Dehos, Tullins (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/094,323

(22) Filed: Apr. 8, 2016

(65) Prior Publication Data

US 2016/0301552 A1 Oct. 13, 2016

(30) Foreign Application Priority Data

Apr. 9, 2015 (FR) ...................................... 15 53074

(51) Int. Cl.
*H04L 27/04* (2006.01)
*H04L 27/12* (2006.01)
(Continued)

(52) U.S. Cl.
CPC ............. *H04L 27/04* (2013.01); *H03B 5/124* (2013.01); *H03B 5/1215* (2013.01);
(Continued)

(58) Field of Classification Search
CPC ..... H03L 7/085; H03L 2207/12; H04L 27/04; H04L 27/125; H03B 2200/0092; H03B 23/00; H03C 3/09
See application file for complete search history.

(56) References Cited

U.S. PATENT DOCUMENTS 6,037,825 A * 3/2000 Kung .................. H03D 7/1433
 327/356
7,424,064 B2 * 9/2008 Shakeshaft ............. H03C 3/40
 341/155
(Continued)

FOREIGN PATENT DOCUMENTS

WO 2008069444 A1 6/2008

OTHER PUBLICATIONS

Preliminary Search Report filed in FR 15/53074 dated Mar. 14, 2016; 2 pgs.
(Continued)

*Primary Examiner* — Khanh C Tran
(74) *Attorney, Agent, or Firm* — Moreno IP Law LLC

(57) ABSTRACT

An ultra-wideband radio frequency transmission system capable of receiving a first signal with discrete levels, and including: a voltage-controlled oscillator capable of supplying a first oscillating signal including an oscillating circuit powered by a power supply circuit comprising at least one first current source controlled by the first signal with discrete levels or a second signal with discrete levels obtained from the first signal with discrete levels; a mixer capable of receiving the first oscillating signal and of supplying a second oscillating signal equal to the first oscillating signal multiplied by a gain which depends on the first signal with discrete levels or on a third signal with discrete levels obtained from the first signal with discrete levels; and an antenna or an electromagnetic coupling device capable of transmitting a radio frequency signal based on the second oscillating signal.

10 Claims, 6 Drawing Sheets

(51) Int. Cl.
H04B 1/00 (2006.01)
H03B 5/12 (2006.01)

(52) U.S. Cl.
CPC ......... *H03B 5/1228* (2013.01); *H03B 5/1278* (2013.01); *H04B 1/0007* (2013.01); *H04L 27/125* (2013.01)

(56) References Cited

U.S. PATENT DOCUMENTS

| | | |
|---|---|---|
| 2004/0017841 A1 | 1/2004 | Siwiak |
| 2006/0038710 A1* | 2/2006 | Staszewski ............... H03F 3/24 341/143 |
| 2013/0142283 A1* | 6/2013 | Hori ...................... H03F 1/0222 375/300 |
| 2014/0323062 A1 | 10/2014 | Siligaris et al. |
| 2014/0349716 A1* | 11/2014 | Axholt ................. H04B 1/0475 455/571 |

OTHER PUBLICATIONS

"A 60-GHz UWB Pulse Generator With Fast Start-Up and Extinction Using Injection Conditions"; 2014 IEEE International Conference on Ultra-Wideband (ICUWB), IEEE; Sep. 1, 2014; pp. 390-393.

* cited by examiner

ULTRA WIDEBAND RADIO FREQUENCY TRANSMISSION SYSTEM

This application claims the priority benefit of French patent application number 15/53074, filed on Apr. 9, 2015, the content of which is hereby incorporated by reference in its entirety to the maximum extent allowable by law.

BACKGROUND

The present disclosure relates to an ultra-wideband radio frequency transmission system and to an ultra-wideband radio frequency transmission method.

DISCUSSION OF THE RELATED ART

A radio frequency transmission system belongs to a radio frequency communication system which may in particular be used to replace a cable communication system.

Generally, a radio frequency transmission system receives a signal with discrete levels which contain the useful data to be transmitted. As an example, the signal with discrete levels corresponds to an analog signal modulated according to a line coding, especially the NRZ coding (Non Return to Zero) and obtained by digital-to-analog conversion of a binary signal. The radio frequency transmission system then transforms the signal with discrete levels into an analog oscillating signal where the information contained in the signal with discrete levels is coded. This step is called modulation. The radio frequency transmission system may further transpose the analog signal into a radio frequency band adapted to the propagation channel having the transposed analog signal transmitted thereon.

An ultra-wideband or UWB radio frequency transmission system is a radio frequency transmission system for which the ratio of the bandwidth to the central frequency of the transmitted signal is greater than or equal to 20% or for which the bandwidth of the transmitted signal is larger than or equal to 250 MHz or 500 MHz according to countries.

An example of modulation capable of being implemented in a UWB transmission system is the amplitude shift keying or ASK, where the information contained in the signal with discrete levels is represented by amplitude variations of a carrier wave. A specific case of ASK modulation is the on-off keying or OOK where the binary data are represented by the presence or by the absence of the carrier wave. An advantage of a UWB radio frequency transmission method implementing an ASK modulation is that the ASK modulation may be directly applied to the carrier wave. There is then no frequency transposition.

Known UWB radio frequency transmission systems may have a data transmission rate which is insufficient for certain applications. Further, known UWB radio frequency transmission systems may be insufficiently robust with respect to sources of disturbance of the transmitted signal. Further, known UWB radio frequency transmission systems may have an excessive electric power consumption.

SUMMARY

An object of an embodiment is to overcome all or part of the disadvantages of the previously-described UWB radio frequency transmission systems and UWB radio frequency transmission methods.

Another object of an embodiment is to increase the data transmission rate of the UWB radio frequency transmission system.

Another object of an embodiment is to increase the robustness of the UWB radio frequency transmission method.

Another object of an embodiment is that the UWB radio frequency transmission method implements an ASK modulation.

Thus, an embodiment provides an ultra-wideband radio frequency transmission system capable of receiving a first signal with discrete levels, and comprising a voltage-controlled oscillator capable of supplying a first oscillating signal comprising an oscillating circuit powered by a supply circuit comprising at least one first current source controlled by the first signal with discrete levels or a second signal with discrete levels obtained from the first signal with discrete levels; a mixer capable of receiving the first oscillating signal and of supplying a second oscillating signal equal to the first oscillating signal multiplied by a gain which depends on the first signal with discrete levels or on a third signal with discrete levels obtained from the first signal with discrete levels; and an antenna or an electromagnetic coupling device capable of transmitting a radio frequency signal based on the second oscillating signal.

According to an embodiment, the voltage-controlled oscillator is capable of supplying the first oscillating signal at a first oscillation frequency when the first signal with discrete levels or the second signal with discrete levels is in a first state and of supplying the first oscillating signal at a second oscillation frequency, different from the first oscillation frequency, when the first signal with discrete levels or the second signal with discrete levels is in a second state.

According to an embodiment, the first current source is activated when the first signal with discrete levels or the second signal with discrete levels is in the first state and is deactivated when the first signal with discrete levels or the second signal with discrete levels is in the second state.

According to an embodiment, the power supply circuit comprises a second permanently activated current source in parallel with the first current source.

According to an embodiment, the radio frequency transmission system comprises a series-to-parallel conversion unit capable of receiving the first signal with discrete levels at a first frequency and capable of supplying at least fourth and fifth signals with discrete levels at a second frequency lower than the first frequency and comprising a combinational logic unit capable of receiving the fourth and fifth signals with discrete levels and of supplying the second signal with discrete levels and the third signal with discrete levels.

According to an embodiment, the mixer comprises a transconductance amplifier capable of receiving the first oscillating signal and comprising an output connected to a node, capable of supplying the second oscillating signal, by at least one first switch controlled by the first signal with discrete levels or the third signal with discrete levels.

According to an embodiment, the mixer comprises at least one second switch assembled in parallel with the first switch and controlled by a sixth signal with discrete levels obtained from the first signal with discrete levels.

According to an embodiment, the mixer comprises at least one third switch assembled in parallel with the first switch and controlled by a constant analog control signal.

An embodiment provides an ultra-wideband radio frequency transmission method comprising the steps of receiving a first signal with discrete levels; supplying a first oscillating signal by means of a voltage-controlled oscillator comprising an oscillating circuit powered by a supply circuit comprising at least one first current source controlled by the first signal with discrete levels or a second signal with discrete levels obtained from the first signal with discrete levels; supplying a second oscillating signal, by means of a mixer, equal to the first oscillating signal multiplied by a gain which depends on the first signal with discrete levels or on a third signal with discrete levels obtained from the first signal with discrete levels; and transmitting a radio frequency signal based on the second oscillating signal by means of an antenna or of an electromagnetic coupling device.

According to an embodiment, the voltage-controlled oscillator supplies the first oscillating signal at a first oscillation frequency when the first signal with discrete levels or the second signal with discrete levels is in a first state and supplies the first oscillating signal at a second oscillation frequency, different from the first oscillation frequency, when the first signal with discrete levels or the second signal with discrete levels is in a second state.

The foregoing and other features and advantages will be discussed in detail in the following non-limiting description of specific embodiments in connection with the accompanying drawings.

DETAILED DESCRIPTION

Figure 1:
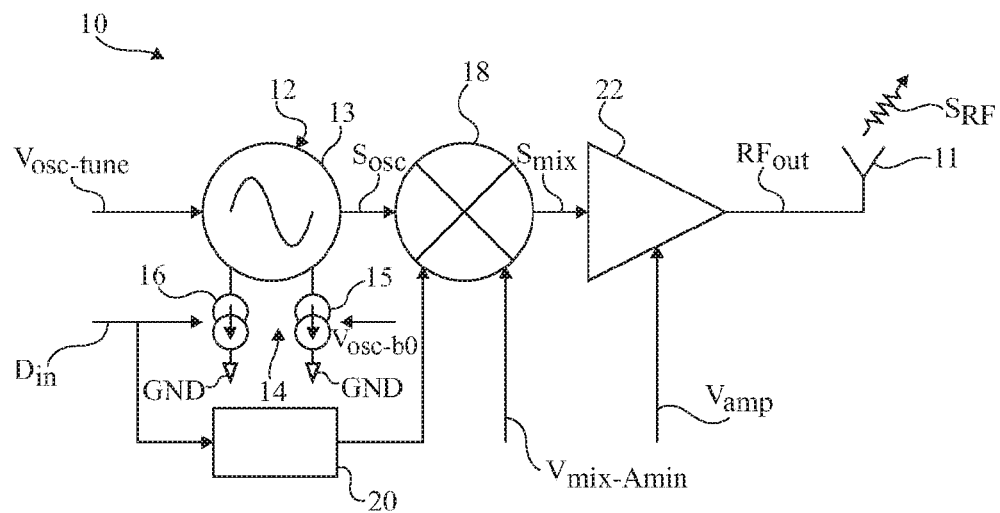
FIG. 1 partially and schematically shows an embodiment of a UWB radio frequency transmission system implementing a FSK or ASK modulation.

The same elements have been designated with the same reference numerals in the different drawings. For clarity, only those elements which are useful to the understanding of the described embodiments have been shown and are detailed. Unless otherwise specified, expressions "approximately", "substantially", and "in the order of" mean to within 10%, preferably to within 5%. Further, a signal which can only remain constant at certain discrete values is called "signal with discrete levels". As an example, a signal which alternates between a first constant state, for example, a low state, noted "0", and a second constant state, for example, a high state, noted "1", is called "two-level signal". An example of a two-level signal is an analog signal modulated according to a line coding, particularly a RZ coding (Return to Zero), a NRZ coding, a PPM coding (Pulse Position Modulation), etc. Another example of a two-level signal is a binary digital signal. The high and low states of two-level signals of a same electronic circuit may be different. In practice, the two-level signals may correspond to voltages or to currents which may not be perfectly constant in the high or low state. As an example, in the case of a circuit coupled between a source of a high power supply voltage VDD and a source of a reference voltage GND, for example, the ground, state "1" of a two-level signal of the circuit may correspond to the high power supply voltage and state "0" of a two-level signal of the circuit may correspond to the reference voltage.

FIG. 1 shows an embodiment of a UWB radio frequency transmission system 10.

Radio frequency transmission system 10 receives a signal with discrete levels $D_{in}$, for example, a two-level signal, rated at a frequency F and containing the useful data to be transmitted. System 10 transmits a radio frequency signal $S_{RF}$ by means of a transmit antenna 11. As an example, the frequency of signal $S_{RF}$ may be in the range from 57 GHz to 66 GHz. According to another embodiment, antenna 11 may be replaced with an electromagnetic coupling device.

Radio frequency transmission system 10 comprises a voltage-controlled oscillator 12 or VCO. VCO 12 comprises an oscillating circuit 13 supplied with current by a supply circuit 14. Oscillating circuit 13 receives a control signal $V_{osc\text{-}tune}$ and supplies an analog oscillating signal $S_{osc}$. Supply circuit 14 comprises a first current source 15 which is controlled by a signal $V_{osc\text{-}b0}$ and a second current source 16 which is controlled by signal $D_{in}$. As an example, each current source 15, 16 comprises a terminal connected to oscillating circuit 13 and a terminal connected to a source of a reference voltage GND, for example, the ground.

Radio frequency transmission system 10 further comprises a mixer or a switch 18 which receives signals $S_{osc}$ and $D_{in}$ and a control signal $V_{mix\text{-}Amin}$ and which supplies an analog oscillating signal $S_{mix}$. System 10 may further comprises a delay unit 20 delaying signal $D_{in}$ supplied to mixer 18 with respect to signal $D_{in}$ supplied to current source 16 to take into account the response time of VCO 12. However, in the case where the response time of VCO 12 is small as compared with the period of signal $D_{in}$, delay unit 20 may be absent.

According to an embodiment, radio frequency transmission system 10 further comprises an amplifier 22 controlled by a control signal $V_{amp}$. Amplifier 22 receives signal $S_{mix}$ and supplies an amplified signal $RF_{out}$ which is supplied to antenna 11 for the transmission of radio frequency signal $S_{RF}$. As a variation, amplifier 22 may be absent in the case where signal $S_{mix}$ has a sufficient power to be directly transmitted by antenna 11.

Signal $D_{in}$ contains the useful data to be transmitted. Signal $D_{in}$ may be a binary signal.

Conventionally, VCO 12 supplies an analog oscillating signal, for example, a sinusoidal signal, having its frequency depending on signal $V_{osc\text{-}tune}$. However, according to an embodiment, signal $V_{osc\text{-}tune}$ is kept constant and the amplitude and the frequency of signal $S_{osc}$ supplied by VCO 12 are modified by varying the intensity of the power supply current of oscillating circuit 13 supplied by supply circuit 14. According to an embodiment, current source 15 is permanently activated, control signal $V_{osc-b0}$ being kept constant. Current source 16 is activated when signal $D_{in}$ is at "1" and is deactivated when signal $D_{in}$ is at "0". The intensity of the current supplying oscillating circuit 13, when current sources 15 and 16 are activated, is higher than the intensity of the current supplying oscillating circuit 13 when only current source 15 is activated.

Signal Sosc is an oscillating signal, for example, a sinusoidal signal, having a pulse $\omega_{osc}$ and an amplitude $A_{osc}$. When signal $D_{in}$ is at "0", pulse $\omega_{osc}$ of signal $S_{osc}$ is equal to $\omega_{osc}^0$ and amplitude $A_{osc}$ of signal $S_{osc}$ is equal to $A_{osc}^0$. When signal $D_{in}$ is at "1", pulse $\omega_{osc}$ of signal $S_{osc}$ is equal to $\omega_{osc}^0$ and amplitude $A_{osc}$ of signal $S_{osc}$ is equal to $A_{osc}^1$. Signal $S_{osc}$ supplied by oscillator 12 thus follows the following relations (1):

$$S_{osc} = \begin{cases} S_{osc}^1 = A_{osc}^1 \cos(\omega_{osc}^1 t), & D_{in} = \text{"1"} \\ S_{osc}^0 = A_{osc}^0 \cos(\omega_{osc}^0 t), & D_{in} = \text{"0"} \end{cases} \quad (1)$$

Mixer 18 multiplies signal Sosc with a mixing gain $G_{mix}$ (which depends on signal $D_{in}$ and $V_{mix-Amin}$ and which may take one or the other of values $G_{mix}^0$ and $G_{mix}^1$. Signal $S_{mix}$ has the same pulse $\omega_{osc}$ as signal $S_{osc}$. When signal $D_{in}$ is at "0", pulse $\omega_{osc}$ of signal $S_{mix}$ is equal to $\omega_{osc}^0$ and amplitude $A_{mix}$ of signal $S_{mix}$ is equal to $A_{mix}^0$. When signal $D_{in}$ is at "1", pulse $\omega_{osc}$ of signal $S_{mix}$ is equal to $\omega_{osc}^1$ and amplitude $A_{mix}$ of signal $S_{mix}$ is equal to $A_{mix}^1$. More specifically, signal $S_{mix}$ supplied by mixer 18 follows the following relations (2):

$$S_{mix} = \begin{cases} S_{osc}^1 \cdot G_{mix}^1 = G_{mix}^1 \cdot A_{osc}^1 \cos(\omega_{osc}^1 t) = A_{mix}^1 \cos(\omega_{osc}^1 t), & D_{in} = \text{"1"} \\ S_{osc}^0 \cdot G_{mix}^0 = G_{mix}^0 \cdot A_{osc}^0 \cos(\omega_{osc}^0 t) = A_{mix}^0 \cos(\omega_{osc}^0 t), & D_{in} = \text{"0"} \end{cases} \quad (2)$$

Signal $S_{mix}$ is thus simultaneously modulated by amplitude and frequency shift keying. The frequency shift keying modulation, or FSK modulation, is performed by oscillator 12 and the amplitude modulation ratio is imposed by mixer 18. The amplitude modulation ratio is thus set independently from the frequency modulation ratio.

Figure 2:
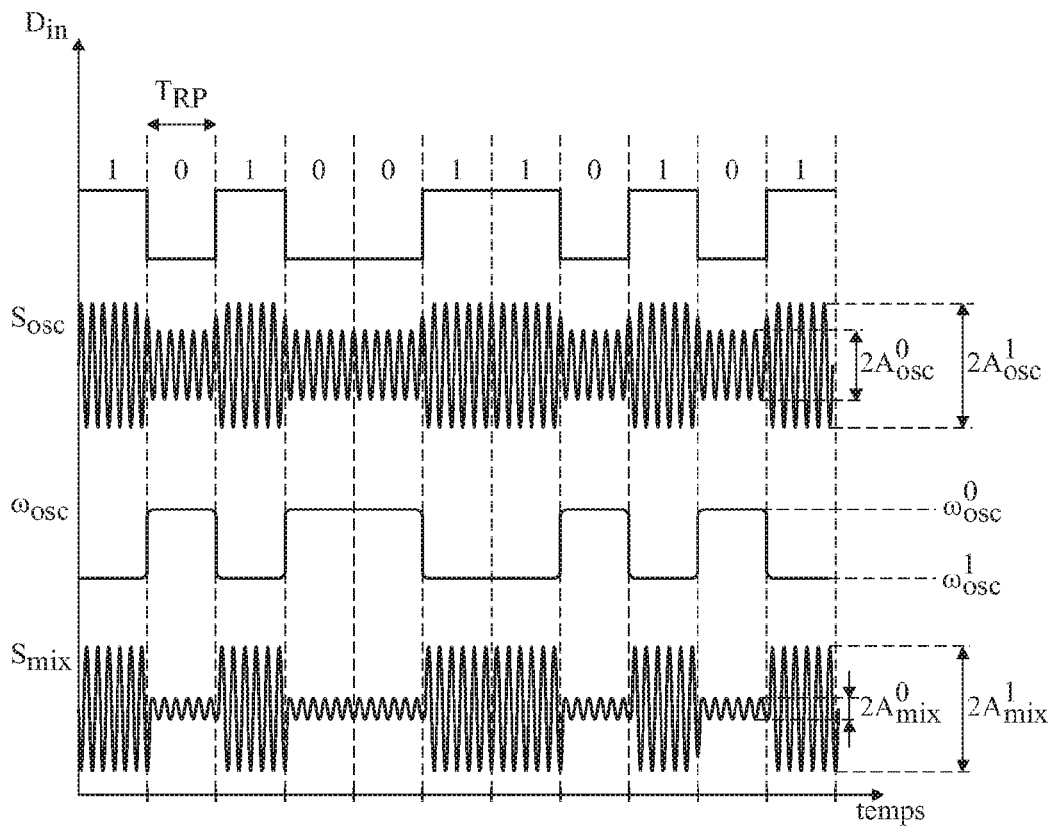
FIG. 2 is a timing diagram of signals used by the radio frequency transmission system of FIG. 1.

FIG. 2 shows an example of timing diagram of binary signal $D_{in}$, of analog signal Sosc, of pulse $\omega_{osc}$, and of analog signal $S_{mix}$ in the case where the sequence of binary data to be transmitted is "10100110101".

As an example, radio frequency transmission system 10 may, with a radio frequency reception system, be used to replace a cable link.

Figure 3:
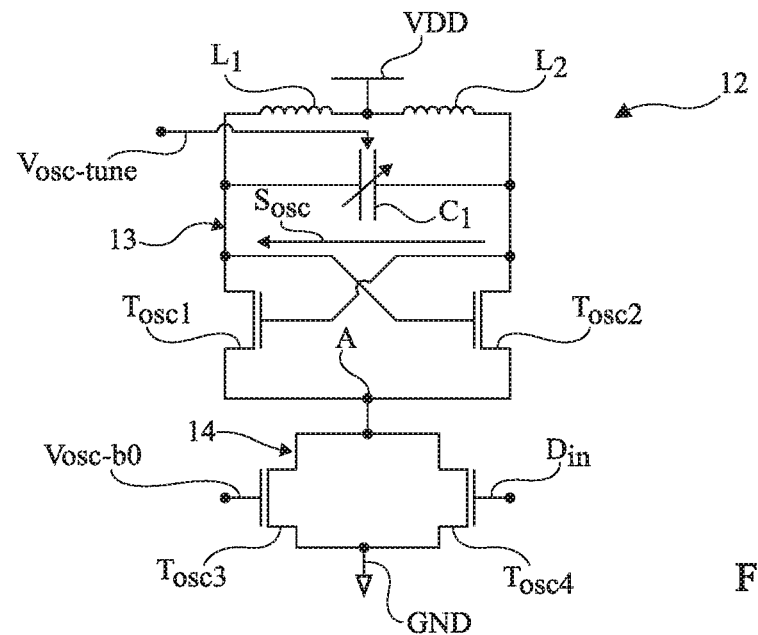
FIGS. 3 and 4 shows more detailed electric diagrams of two embodiments of a portion of the radio frequency transmission system of FIG. 1.

FIG. 3 shows an embodiment of VCO 12. Oscillating circuit 13 comprises a first N-channel MOS transistor $T_{osc1}$ having its drain connected to a source of a high power supply voltage VDD via an inductance $L_1$ and having its source connected to a node A. Oscillating circuit 13 further comprises a second N-channel MOS transistor $T_{osc2}$ having its drain connected to the source of high power supply voltage VDD via an inductance $L_2$ and having its source connected to node A. The gate of transistor $T_{osc1}$ is connected to the drain of transistor $T_{osc2}$. The gate of transistor $T_{osc2}$ is connected to the drain of transistor $T_{osc1}$. Oscillating circuit 13 further comprises a capacitor $C_1$ of variable capacitance, having its capacitance controlled by signal $V_{osc-tune}$, assembled between the drains of transistors $T_{osc1}$ and $T_{osc2}$. Signal $S_{osc}$ corresponds to the voltage between the drains of transistors $T_{osc1}$ and $T_{osc2}$.

Supply circuit 14 comprises a third N-channel MOS transistor $T_{osc3}$ having its drain connected to node A, having its source connected to ground GND, and having its gate receiving signal $V_{osc-b0}$. Supply circuit further comprises a fourth N-channel MOS transistor $T_{osc4}$ having its drain connected to node A, having its source connected to ground GND, and having its gate receiving signal $D_{in}$.

In operation, signal $V_{osc-tune}$ is constant and signal $V_{osc-b0}$ is equal to "1". Transistor $T_{osc3}$ is thus permanently conductive. Signal $D_{in}$ may be equal to "0" or "1". When signal $D_{in}$ is at "0", transistor $T_{osc4}$ is non-conductive and the intensity of the current supplied by supply circuit 14 is imposed by transistor $T_{osc3}$. Amplitude $A_{osc}$ of signal Sosc is then equal to $A_{osc}^0$. When signal $D_{in}$ is at "1", transistors $T_{osc3}$ and $T_{osc4}$ are conductive and the intensity of the current supplied by supply circuit 14 is higher. Amplitude $A_{osc}$ of signal $S_{osc}$ is then equal to $A_{osc}^1$.

The nominal value of pulse $\omega_{osc}$ is imposed, in particular, by the design of oscillating circuit 13 and by the value of signal $V_{osc-tune}$. The difference between values $\omega_{osc}^0$ and $\omega_{osc}^1$ of the pulse when signal $D_{in}$ is respectively equal to "0" and "1" originates from the capacitance variation in oscillating circuit 13 when the intensity of the supply current of oscillating circuit 13 varies.

Figure 4:
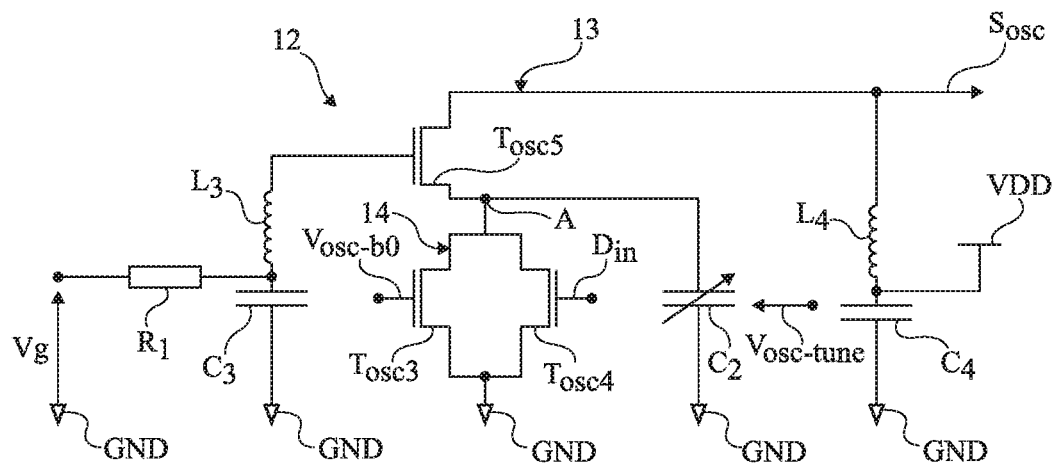

FIG. 4 shows another embodiment of VCO 12 where supply circuit 14 has the same structure as that shown in FIG. 3 and where oscillating circuit 13 comprises an N-channel MOS transistor $T_{osc5}$ having its source connected to node A and having its drain supplying signal $S_{osc}$. Node A is further connected to ground GND by a variable-capacitance capacitor $C_2$ having its capacitances controlled by signal $V_{osc-tune}$. The gate of transistor $T_{osc5}$ is connected to ground GND via an inductance $L_3$ in series with a capacitor $C_3$. The junction point of inductance $L_3$ and of capacitor $C_3$ is connected to a source of a control voltage $V_g$ via a resistor $R_1$. The drain of transistor $T_{osc5}$ is connected to ground GND via an inductance $L_4$ in series with a capacitor $C_4$. The junction point of inductance $L_4$ and capacitor $C_4$ is connected to the source of high power supply voltage VDD.

FIGS. 3 and 4 show specific embodiments of VCO 12. It should however be clear that oscillator 12 may correspond to any type of voltage-controlled oscillator comprising an oscillating circuit powered with a supply circuit and for which the intensity of the current supplied by the supply circuit is capable of being controlled by a binary signal.

Figure 5:
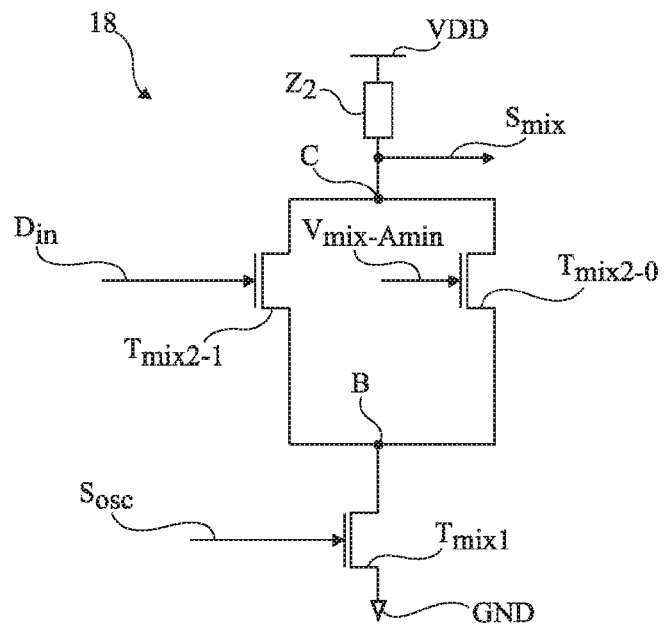
FIG. 5 shows a more detailed electric diagram of an embodiment of another portion of the radio frequency transmission system of FIG. 1.

FIG. 5 shows an embodiment of mixer 18. Mixer 18 comprises an N-channel MOS transistor $T_{mix1}$ having its source connected to ground GND, having its drain connected to a node B, and having its gate receiving oscillating signal $S_{osc}$. Mixer 18 further comprises N-channel MOS transistors $T_{mix2-0}$ and $T_{mix2-1}$ assembled in parallel between node B and a node C. The gate of transistor $T_{mix2-1}$ receives binary signal $D_{in}$ and the gate of transistor $T_{mix2-0}$ receives a signal $V_{mix-Amin}$. Node C is further connected to the source of high voltage VDD by an impedance load $Z_2$. Signal $S_{mix}$ corresponds to the voltage between node C and ground GND.

Transistor $T_{mix1}$ plays the role of a transconductance amplifier while transistors $T_{mix2-0}$ and $T_{mix2-1}$ operate as switches. In operation, signal $V_{mix-Amin}$ is kept constant. Transistor $T_{mix2-0}$ is thus permanently conductive. Signal $D_{in}$ may be equal to "0" or "1". When signal $D_{in}$ is at "0", transistor $T_{mix2-1}$ is non-conductive and mixing gain $G_{mix}$ is equal to $G_{mix}^0$. When signal $D_{in}$ is at "1", transistors $T_{mix2-0}$ and $T_{mix2-1}$ are conductive and mixing gain "$G_{mix}$ is equal to $G_{mix}^1$.

Given that transistors $T_{mix2-0}$ and $T_{mix2-1}$ are assembled in parallel, mixing gain $G_{mix}$ may be expressed according to the following relations (3):

$$G_{mix} = \begin{cases} G_{mix}^1 = G_{T_{mix2-0}}^{V_{mix\text{-}Amin}} + G_{T_{mix2-1}}^1, & D_{in} = \text{``1''} \\ G_{mix}^0 = G_{T_{mix2-0}}^{V_{mix\text{-}Amin}}, & D_{in} = \text{``0''} \end{cases} \quad (3)$$

Signal $S_{mix}$ is thus defined by the following relations (4):

$$A_{mix} = \begin{cases} A_{mix}^1 = \left( G_{T_{mix2-0}}^{V_{mix\text{-}Amin}} + G_{T_{mix2-1}}^1 \right) \cdot A_{osc}^1, & D_{in} = \text{``1''} \\ A_{mix}^0 = G_{T_{mix2-0}}^{V_{mix\text{-}Amin}} \cdot A_{osc}^0, & D_{in} = \text{``0''} \end{cases} \quad (4)$$

$$\omega_{osc} = \begin{cases} \omega_{osc}^1, & D_{in} = \text{``1''} \\ \omega_{osc}^0, & D_{in} = \text{``0''} \end{cases}$$

The modulation ratio $Dyn_{ASK}$ of the amplitude shift keying modulation implemented by radio frequency transmission system 10 is provided by the following relation (5):

$$Dyn_{ASK} = \frac{A_{osc}^1}{A_{osc}^0} \cdot \left( 1 + \frac{G_{T_{mix2-1}}^1}{G_{T_{mix2-0}}^{V_{mix\text{-}Amin}}} \right) \quad (5)$$

Modulation ratio $Dyn_{ASK}$ may be modified independently from the FSK modulation performed by oscillator 18. In particular, by varying voltage $V_{mix\text{-}Amin}$, the conduction properties of transistor $T_{mix2-0}$ may be modified, which enables to vary modulation ratio $Dyn_{ASK}$.

Figure 6:
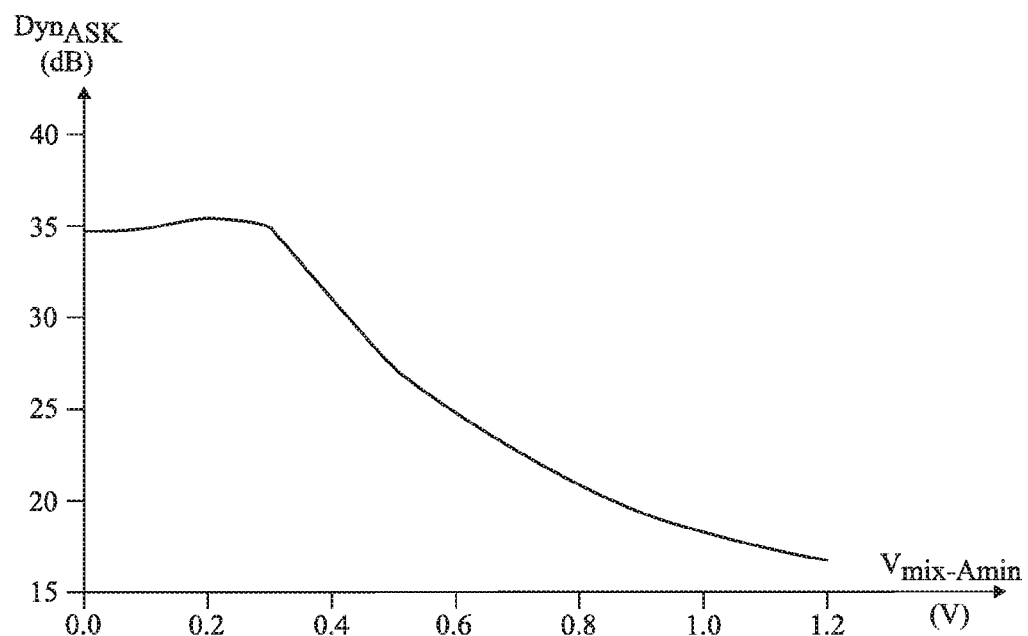
FIG. 6 shows a curve of the variation of the amplitude modulation ratio of the radio frequency transmission system of FIG. 1 according to a signal used by the radio frequency transmission system.

FIG. 6 shows an example of a curve of variation of modulation ratio $Dyn_{ASK}$ according to voltage $V_{mix\text{-}Amin}$.

As compared with a transmission system comprising a VCO permanently supplying an oscillating signal through a switch which is controlled to carry out an OOK modulation, the electric power consumption of radio frequency transmission system 10 shown in FIG. 1 is decreased since the intensity of the current consumed by oscillator 12 varies with the amplitude of signal $S_{osc}$.

According to an embodiment, the signal transmitted by radio frequency transmission system 10 may be received by a radio frequency reception system capable of performing an amplitude demodulation.

According to an embodiment, the signal transmitted by radio frequency transmission system 10 may be received by a radio frequency reception system capable of performing a frequency demodulation.

Figure 7:
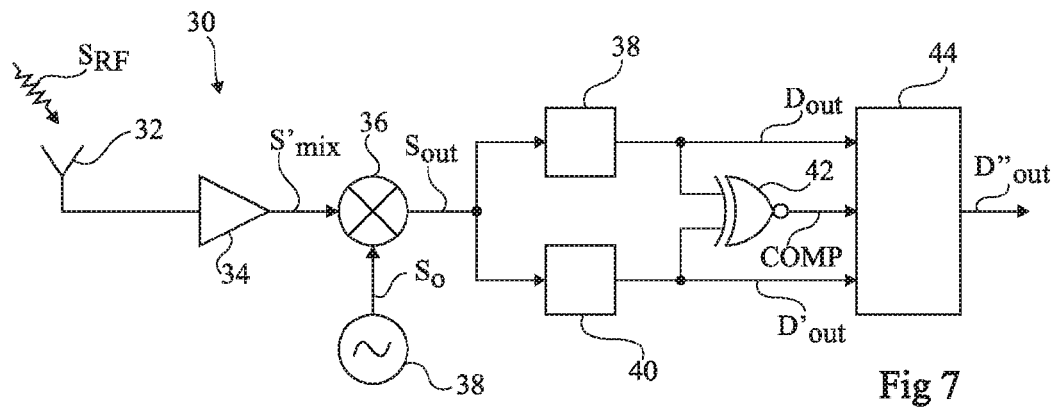
FIG. 7 partially and schematically shows an embodiment of a radio frequency reception system capable of receiving a signal transmitted by the radio frequency transmission system of FIG. 1.

FIG. 7 shows an embodiment of a radio frequency reception system 30 receiving the signal transmitted by radio frequency transmission system 10 and capable of simultaneously carrying out a frequency demodulation and an amplitude demodulation. Radio frequency reception system 30 comprises a receive antenna 32 receiving radio frequency signal $S_{RF}$ and connected to a low-noise amplifier 34 which supplies an oscillating signal $S'_{mix}$ to a mixer 36. Signal $S'_{mix}$ substantially corresponds to previously-described signal $S_{mix}$ which may have been modified by various sources of disturbance during the propagation of the signal transmitted by radio frequency transmission system 10. Mixer 36 further receives an oscillating signal $S_o$ supplied by an oscillator 38 which is mixed with signal $S'_{mix}$ to supply a baseband signal $S_{out}$, possibly after filtering. Signal $S_{out}$ is supplied to a first processing unit 38 capable of implementing an amplitude demodulation and which supplies a binary signal Dout. Signal Sout is further supplied to a second processing unit 40 capable of implementing a frequency demodulation and which supplies a binary signal D' out.

Radio frequency reception system 30 may compare binary signals $D_{in}$ and $D'_{out}$ to determine whether the radiofrequency signal $S_{RF}$ received by antenna 32 has been modified during its transmission. As an example, radio frequency reception system 30 may comprise a logic block of "XOR" type 42 which supplies a binary signal COMP at state "0" if binary signals $D_{in}$ and $D'_{out}$ are identical and which supplies binary signal COMP at state "1" if binary signals $D_{out}$ and $D'_{out}$ are different. Signals $D_{out}$, $D'_{out}$ and COMP may be transmitted to a correction unit 44 which may supply a corrected binary signal $D''_{out}$.

The simultaneous implementation of an amplitude shift keying modulation and of a frequency shift keying modulation by radio frequency transmission system 10 advantageously enables to increase the robustness of the transmission since radio frequency reception system 30 may implement of a specific correction method taking advantage of this double modulation, in addition to possible other correction methods specific to each type of modulation. Further, the fact for the FSK modulation to be carried out by VCO 12 and for the ASK modulation to be carried out, for the most part, by mixer 18, enables to distribute the design constraints of radio frequency transmission system 10 on these two components. Thereby, each of these components may be optimized separately, which enables to increase the transmission rate of signal $D_{in}$.

Further, even if the modulation ratio of the ASK modulation carried out by radio frequency transmission system 10 is controlled by the properties of mixer 18, two amplitude shift keying modulation steps are actually carried out by system 10, the first one by oscillator 12 (by the cooperation of oscillating circuit 13 and of supply circuit 14), and the second one by mixer 18. This advantageously enables to obtain transition edges between the two amplitude shift keying modulations which are more abrupt than those which would be obtained if a single amplitude shift keying modulation step was implemented. Indeed, an amplitude shift keying modulation comprises multiplying an oscillating signal with a modulating signal having its transition edges, in the present embodiment, corresponding to the transition edges of a MOS transistor between the non-conductive and conductive states. The fact of carrying out two shift keying modulation steps amounts to multiplying the oscillating signal twice by such a modulating signal and thus of shortening the transition between two amplitude shift keying modulation levels.

Further, current source 15 is preferably permanently activated. This enables to ascertain that oscillator 12 is permanently operating, even if it consumes less when only current source 15 is activated. Thereby, when current source 16 switches from the deactivated state to the activated state, oscillator 12 is already operating and reacts faster than if it was off.

Figure 8:
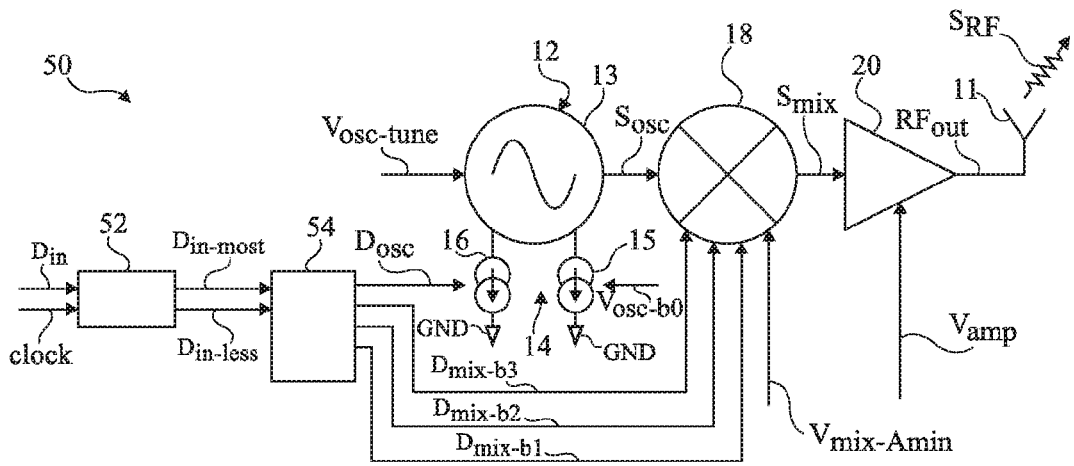
FIG. 8 partially and schematically shows another embodiment of a UWB radio frequency transmission system implementing a FSK or ASK modulation.

FIG. 8 shows another embodiment of a UWB radio frequency transmission system 50 capable of operating at a higher transmission rate than radio frequency transmission system 10.

Radio frequency transmission system 50 comprises all the elements of radio frequency transmission system 10 with the difference that VCO 12 and mixer 18 are not directly controlled by signal $D_{in}$. Radio frequency transmission system 50 comprises a series-to-parallel conversion unit 52 which receives a clock signal clock of frequency $2F_{RF}$ and of period $T_{RF}/2$ and binary signal $D_{in}$ rated at frequency $2F_{RP}$ and which supplies two binary signals $D_{in\text{-}most}$ and $D_{in\text{-}less}$ in phase and each rated at frequency $F_{RP}$. Binary signals $D_{in\text{-}most}$ and $D_{in\ less}$ may be determined as follows: when signal $D_{in}$ is successively at a first value for a time period $T_{RP}/2$ and at a second value for a time period $T_{RP}/2$, signal $D_{in\text{-}most}$ is set to the first value for a time period $T_{RP}$ and signal $D_{in}$ less is simultaneously set to the second value for the same time period $T_{RP}$.

Radio frequency transmission system 50 further comprises a combinational logic unit 54 receiving binary signals Din-most and Din-less and supplying binary signals Dosc, Dmix-b1, Dmix-b2 and Dmix-b3 in phase and each rated at frequency FRP.

Radio frequency transmission system 50 may further comprise delay units, similar to previously-described unit 20, for each signal $D_{osc}$, $D_{mix\text{-}b1}$, $D_{mix\text{-}b2}$ and $D_{mix\text{-}b3}$.

According to an embodiment, the truth table of unit 54 is the following:

| $D_{in\text{-}most}$ | $D_{in\text{-}less}$ | $D_{osc}$ | $D_{mix\text{-}b3}$ | $D_{mix\text{-}b2}$ | $D_{mix\text{-}b1}$ |
|---|---|---|---|---|---|
| 0 | 0 | 0 | 0 | 0 | 0 |
| 0 | 1 | 0 | 0 | 0 | 1 |
| 1 | 0 | 1 | 0 | 1 | 1 |
| 1 | 1 | 1 | 1 | 1 | 1 |

According to an embodiment, current source 16 of VCO 12 is controlled by signal $D_{osc}$ and mixer 18 is controlled by signals $D_{mix\text{-}b1}$, $D_{mix\text{-}b2}$, and $D_{mix\text{-}b3}$.

According to an embodiment, signal $S_{mix}$ is modulated on four amplitude levels and two frequency levels. Each amplitude level of signal $S_{mix}$ is associated with a symbol "00", "01", "10", or "11" formed of the succession of two values of binary signal $D_{in}$.

When signal $D_{in\text{-}most}$ is at "0", whatever the value of signal $D_{in\text{-}less}$, pulse $\omega_{osc}$ of signal $S_{osc}$ is equal to $\omega_{osc}^0$ and amplitude $A_{osc}$ of signal $S_{osc}$ is equal to $A_{osc}^0$. When signal $D_{in\text{-}most}$ is at "1", whatever the value of signal $D_{in\text{-}less}$, pulse $\omega_{osc}$ of signal $S_{osc}$ is equal to $\omega_{osc}^1$ and amplitude $A_{osc}$ of signal $S_{osc}$ is equal to $A_{osc}^1$. Signal $S_{osc}$ supplied by oscillator 12 thus follows the following relation (6):

$$S_{osc} = \begin{cases} S_{osc}^1 = A_{osc}^1 \cos(\omega_{osc}^1 t), & D_{in\text{-}most} = "1" \\ S_{osc}^0 = A_{osc}^0 \cos(\omega_{osc}^0 t), & D_{in\text{-}most} = "0" \end{cases} \quad (6)$$

Mixer 18 multiplies signal $S_{osc}$ with a mixing gain $G_{mix}$ having its value depending on signals $D_{mix\text{-}b1}$, $D_{mix\ b2}$, and $D_{mix\text{-}b3}$ and $V_{mix\text{-}Amin}$ and may take four values $G_{mix}^{ij}$ where i corresponds to $D_{in\text{-}less}$ and j corresponds to $D_{in\text{-}most}$.

Signal $S_{mix}$ supplied by mixer 18 follows the following relations (7):

$$S_{mix} = \begin{cases} G_{mix}^{01} S_{osc}^1 = G_{mix}^{01} \cdot A_{osc}^1 \cos(\omega_{osc}^1 t) = A_{mix}^{01} \cos(\omega_{osc}^1 t), & D_{in\text{-}less} = "0", D_{in\text{-}most} = "1" \\ G_{mix}^{11} S_{osc}^1 = G_{mix}^{11} \cdot A_{osc}^1 \cos(\omega_{osc}^1 t) = A_{mix}^{11} \cos(\omega_{osc}^1 t), & D_{in\text{-}less} = "1", D_{in\text{-}most} = "1" \\ G_{mix}^{00} S_{osc}^0 = G_{mix}^{00} \cdot A_{osc}^0 \cos(\omega_{osc}^0 t) = A_{mix}^{00} \cos(\omega_{osc}^0 t), & D_{in\text{-}less} = "0", D_{in\text{-}most} = "0" \\ G_{mix}^{10} S_{osc}^0 = G_{mix}^{10} \cdot A_{osc}^0 \cos(\omega_{osc}^0 t) = A_{mix}^{10} \cos(\omega_{osc}^0 t), & D_{in\text{-}less} = "1", D_{in\text{-}most} = "0" \end{cases}$$

Figure 9:
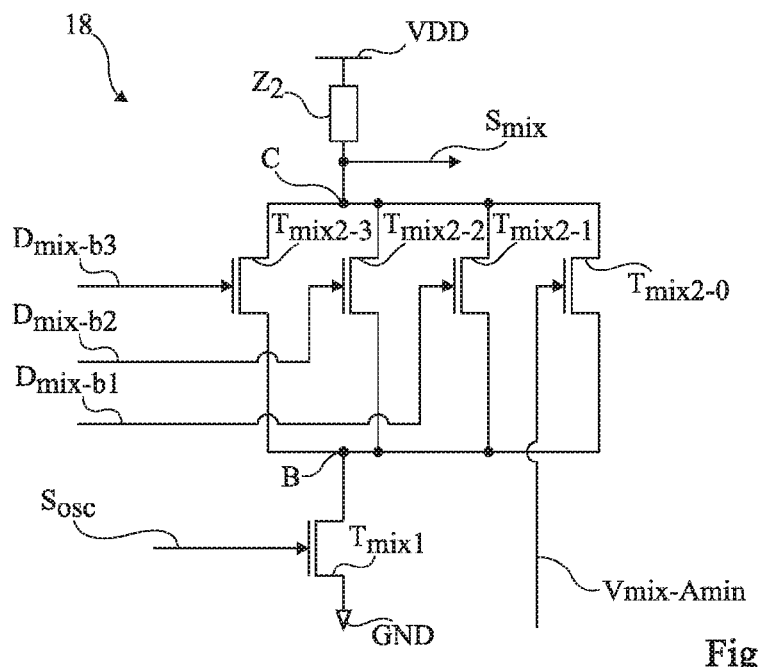
FIG. 9 shows a more detailed electric diagram of an embodiment of a portion of the radio frequency transmission system of FIG. 8.

FIG. 9 shows an embodiment of mixer 18 adapted to the transmission system 50 shown in FIG. 8. Mixer 18 comprises all the elements shown in FIG. 5, with the difference that the gate of transistor $T_{mix2\text{-}1}$, instead of receiving signal $D_{in}$, receives signal $D_{mix\text{-}b1}$. Mixer 18 further comprises N-channel MOS transistors $T_{mix2\text{-}2}$ and $T_{mix2\text{-}3}$ assembled in parallel between node B and node C. The gate of transistor $T_{mix2\text{-}2}$ receives signal $D_{mix\text{-}b2}$ and the gate of transistor $T_{mix2\text{-}3}$ receives signal $D_{mix\text{-}b3}$.

Transistors $T_{mix2\text{-}1}$, $T_{mix2\text{-}2}$, and $T_{mix2\text{-}3}$ operate as switches. In operation, signal $V_{mix\text{-}Amin}$ is kept constant. Transistor $T_{mix2\text{-}0}$ is thus permanently conductive. Signals $D_{mix\text{-}b1}$, $D_{mix\text{-}b2}$, and $D_{mix\text{-}b3}$ may each be equal to "0" or "1".

Given that transistors $T_{mix2\text{-}0}$, $T_{mix2\text{-}1}$, $T_{x2\text{-}2}$, and $T_{mix2\text{-}3}$ are assembled in parallel, mixing gain $G_{mix}$ may be expressed according to the following relations (8):

$$G_{mix} = \qquad (8)$$

$$\begin{cases} G_{mix}^{00} = G_{T_{mix2\text{-}0}}^{V_{mix\text{-}Amin}}, & D_{in\text{-}less} = "0", D_{in\text{-}most} = "0" \\ G_{mix}^{01} = G_{T_{mix2\text{-}0}}^{V_{mix\text{-}Amin}} + G_{T_{mix2\text{-}1}}^1, & D_{in\text{-}less} = "0", D_{in\text{-}most} = "1" \\ G_{mix}^{10} = G_{T_{mix2\text{-}0}}^{V_{mix\text{-}Amin}} + G_{T_{mix2\text{-}1}}^1 + G_{T_{mix2\text{-}2}}^1, & D_{in\text{-}less} = "1", D_{in\text{-}most} = "0" \\ G_{mix}^{11} = G_{T_{mix2\text{-}0}}^{V_{mix\text{-}Amin}} + G_{T_{mix2\text{-}1}}^1 + G_{T_{mix2\text{-}2}}^1 + G_{T_{mix2\text{-}3}}^1, & D_{in\text{-}less} = "1", D_{in\text{-}most} = "1" \end{cases}$$

Figure 10:
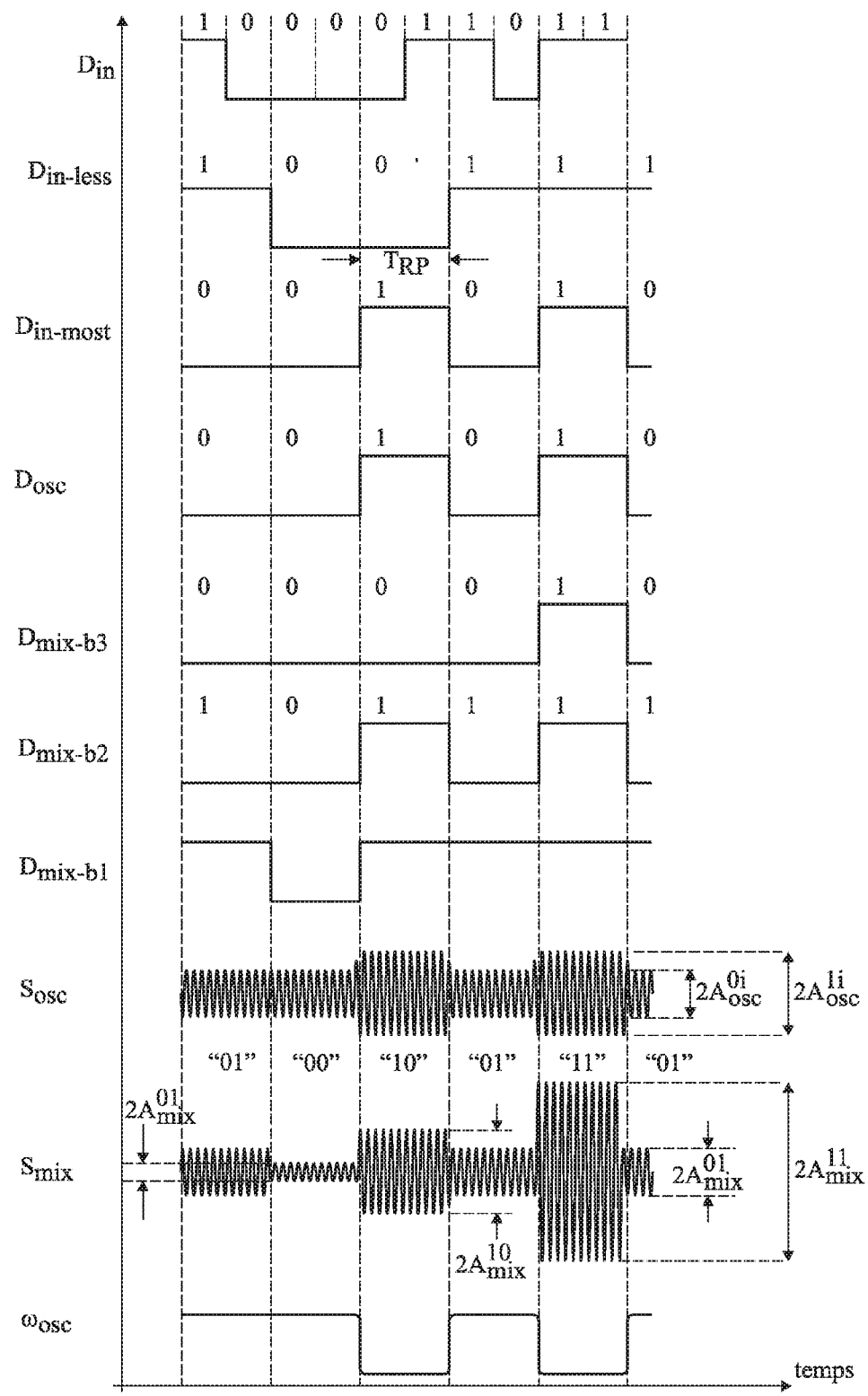
FIG. 10 is a timing diagram of signals used by the radio frequency transmission system of FIG. 8.

FIG. 10 shows a timing diagram of binary signals $D_{in}$, $D_{in\text{-}less}$, $D_{in\text{-}most}$, $D_{osc}$, $D_{mix\text{-}b3}$, $D_{mix\text{-}b2}$, $D_{mix\text{-}b1}$, of analog signal $S_{osc}$ of analog signal $S_{mix}$, and of pulse $\omega_{osc}$. Radio frequency transmission system 50 carries out a FSK modulation on two levels and an ASK modulation on four levels.

The size of switch $T_{mix2\text{-}0}$ and the value of $V_{mix\text{-}Amin}$ define the value of amplitude $A_{mix}{}^{00}$. The ratio of the sizes of switches $T_{mix2\text{-}1}$ and $T_{mix2\text{-}0}$ defines the modulation ratio between symbols "01" and "00", that is, ratio $A_{mix}{}^{01}/A_{mix}{}^{00}$. The ratio of the sizes of switches $T_{mix2\text{-}2}$ and $T_{mix2\text{-}1}$ defines the modulation ratio between symbols "10" and "01", that is, ratio $A_{mix}{}^{10}/A_{mix}{}^{01}$. The ratio of the sizes of switches $T_{mix2\text{-}3}$ and $T_{mix2\text{-}2}$ defines the modulation ratio between symbols "11" and "10", that is, ratio $A_{mix}{}^{11}/A_{mix}{}^{10}$.

As described hereafter, oscillator 12 and mixer 18 of radio frequency transmission system 50 are rated at frequency FRP like radio frequency transmission system 10 while the transmission frequency of signal $D_{in}$ is $2F_{RP}$.

Figure 11:
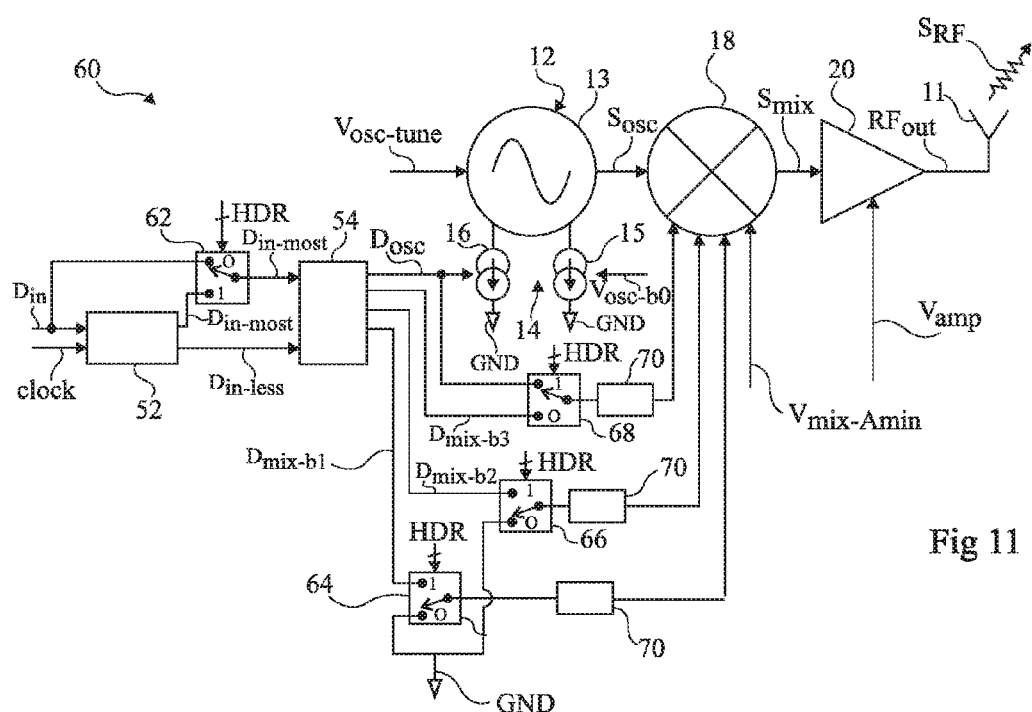
FIG. 11 partially and schematically shows another embodiment of a UWB radio frequency transmission system implementing a FSK or ASK modulation.

FIG. 11 shows another embodiment of a UWB radio frequency transmission system 60 capable of operating at a first transmission rate or at a second transmission rate equal to twice the first transmission rate.

UWB radio frequency transmission system 60 comprises all the elements of radio frequency transmission system 50 shown in FIG. 8 and further comprises a plurality of multiplexers 62, 64, 66, 68. Each multiplexer 62, 64, 66, 68 receives a first signal on a first input and a second signal on a second input and further receives a binary control signal HDR. Each multiplexer 62, 64, 66, 68 outputs the first signal when the control signal is at "0" and outputs the second signal when the control signal is at "1". Multiplexer 62 receives signal $D_{in}$ on the first input and signal $D_{in\text{-}most}$ on the second input. Multiplexer 64 receives signal "0" on the first input and signal $D_{mix\text{-}b1}$ on the second input. Multiplexer 66 receives signal "0" on the first input and signal $D_{mix\text{-}b2}$ on the second input. Multiplexer 68 receives signal $D_{osc}$ on the first input and signal $D_{mix\text{-}b3}$ on the second input. Delay units 70 may be provided, if necessary, at the output of multiplexers 64, 66, and 68.

When signal HDR is at "0", radio frequency transmission system 60 is equivalent to radio frequency transmission system 10 shown in FIG. 1 and can operate at a first transmission rate. When signal HDR is at "1", radio frequency transmission system 60 is equivalent to radio frequency transmission system 50 shown in FIG. 8 and can operate at a second transmission rate equal to twice the first rate.

Specific embodiments have been described. Various alterations, modifications, and improvements will occur to those skilled in the art. In particular, although embodiments have been described where the ASK modulation is performed on two amplitude levels or four amplitude levels, it should be clear that the number of amplitude levels of the ASK modulation may be different. Indeed, according to the previously-described embodiments, the number of amplitude levels of the ASK modulation may be adjusted by modifying the number of transistors and their respective size ratios assembled in parallel between nodes B and C in mixer 18. Further, although embodiments have been described where the FSK modulation is performed on two frequency levels, it should be clear that the number of frequency levels of the FSK modulation may be different. Indeed, according to the previously-described embodiments, the number of frequency levels of the FSK modulation may be adjusted by modifying the number of current sources assembled in parallel of supply circuit 14 of VCO 12.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An ultra-wideband radio frequency transmission system capable of receiving a first signal with discrete levels, and comprising:
   a voltage-controlled oscillator capable of supplying a first oscillating signal comprising an oscillating circuit powered by a supply circuit comprising at least one first current source controlled by the first signal with discrete levels or a second signal with discrete levels obtained from the first signal with discrete levels;
   a mixer capable of receiving the first oscillating signal and of supplying a second oscillating signal equal to the first oscillating signal multiplied by a gain which depends on the first signal with discrete levels or on a third signal with discrete levels obtained from the first signal with discrete levels; and
   an antenna or an electromagnetic coupling device capable of transmitting a radio frequency signal based on the second oscillating signal.

2. The radio frequency transmission system of claim 1, wherein the voltage-controlled oscillator is capable of supplying the first oscillating signal at a first oscillation frequency when the first signal with discrete levels or the second signal with discrete levels is in a first binary state and of supplying the first oscillating signal at a second oscillation frequency, different from the first oscillation frequency, when the first signal with discrete levels or the second signal with discrete levels is in a second binary state.

3. The radio frequency transmission system of claim 2, wherein the first current source is activated when the first signal with discrete levels or the second signal with discrete levels is in the first binary state and is deactivated when the first signal with discrete levels or the second signal with discrete levels is in the second binary state.

4. The radio frequency transmission system of claim 1, wherein the supply circuit comprises a second permanently activated current source in parallel with the first current source.

5. The radio frequency transmission system of claim 1, comprising a series-to-parallel conversion unit capable of receiving the first signal with discrete levels at a first frequency and capable of supplying at least fourth and fifth signals with discrete levels at a second frequency lower than the first frequency and comprising a combinational logic unit capable of receiving the fourth and fifth signals with discrete levels and of supplying the second signal with discrete levels and the third signal with discrete levels.

6. The radio frequency transmission system of claim 1, wherein the mixer comprises a transconductance amplifier capable of receiving the first oscillating signal and comprising an output connected to a node, capable of supplying the second oscillating signal, by at least one first switch controlled by the first signal with discrete levels or the third signal with discrete levels.

7. The radio frequency transmission system of claim 6, wherein, when the at least one first switch is controlled by the first signal with discrete levels, the mixer comprises at least one second switch assembled in parallel with the first switch and controlled by a sixth signal with discrete levels obtained from the first signal with discrete levels.

8. The radio frequency transmission system of claim 6, wherein when the at least one first switch is controlled by the third signal with discrete levels, the mixer comprises at least one third switch assembled in parallel with the first switch and controlled by a constant analog control signal.

9. An ultra-wideband radio frequency transmission method comprising the steps of:
   receiving a first signal with discrete levels;
   supplying a first oscillating signal by means of a voltage-controlled oscillator comprising an oscillating circuit powered by a supply circuit comprising at least one first current source controlled by the first signal with discrete levels or a second signal with discrete levels obtained from the first signal with discrete levels;
   supplying a second oscillating signal, by means of a mixer, equal to the first oscillating signal multiplied by a gain which depends on the first signal with discrete levels or on a third signal with discrete levels obtained from the first signal with discrete levels; and
   transmitting a radio frequency signal based on the second oscillating signal by means of an antenna or an electromagnetic coupling device.

10. The radio frequency transmission method of claim 9, wherein the voltage-controlled oscillator supplies the first oscillating signal at a first oscillation frequency when the first signal with discrete levels or the second signal with discrete levels is in a first binary state and supplies the first oscillating signal at a second oscillation frequency, different from the first oscillation frequency, when the first signal with discrete levels or the second signal with discrete levels is in a second binary state.

* * * * *